United States Patent
Kallal et al.

(10) Patent No.: US 9,614,376 B2
(45) Date of Patent: Apr. 4, 2017

(54) SYSTEMS, APPARATUS, AND METHODS FOR QUANTIFYING POWER LOSSES DUE TO INDUCTION HEATING IN WIRELESS POWER RECEIVERS

(71) Applicant: QUALCOMM Incorporated, San Diego, CA (US)

(72) Inventors: Edward Kenneth Kallal, San Diego, CA (US); Mark White, II, Solana Beach, CA (US); Ryan Tseng, Coronado, CA (US)

(73) Assignee: QUALCOMM Incorporated, San Diego, CA (US)

(*) Notice: Subject to any disclaimer, the term of this patent is extended or adjusted under 35 U.S.C. 154(b) by 455 days.

(21) Appl. No.: 14/464,550

(22) Filed: Aug. 20, 2014

(65) Prior Publication Data

US 2015/0054352 A1   Feb. 26, 2015

Related U.S. Application Data

(60) Provisional application No. 61/869,488, filed on Aug. 23, 2013, provisional application No. 61/883,920, filed on Sep. 27, 2013.

(51) Int. Cl.
*H01F 27/42*   (2006.01)
*H02J 5/00*    (2016.01)
(Continued)

(52) U.S. Cl.
CPC .............. *H02J 5/005* (2013.01); *G01R 21/01* (2013.01); *G01R 29/0814* (2013.01); *G01V 3/12* (2013.01);
(Continued)

(58) Field of Classification Search
USPC ........................................................ 307/104
See application file for complete search history.

(56) References Cited

U.S. PATENT DOCUMENTS 8,766,487 B2   7/2014   Dibben et al.
8,957,549 B2   2/2015   Kesler et al.
(Continued)

FOREIGN PATENT DOCUMENTS

JP   2012244732 A    12/2012
WO   WO-2012127335 A1   9/2012
WO   WO-2013088238 A2   6/2013

OTHER PUBLICATIONS

International Search Report and Written Opinion—PCT/US2014/052145—ISA/EPO—Nov. 11, 2014.
(Continued)

*Primary Examiner* — Danny Nguyen
(74) *Attorney, Agent, or Firm* — Knobbe Martens Olson & Bear LLP

(57) ABSTRACT

Systems, methods and apparatus are disclosed for detecting power losses due to induction heating in wireless power receivers. In one aspect, an apparatus for wireless power transfer comprises a power transfer component configured to transmit wireless power to a wireless power receiver at a power level sufficient to charge or power a load. The apparatus further comprises a communications receiver configured to receive a message from the wireless power receiver, the message comprising a group identifier. The apparatus further comprises a controller circuit operationally coupled to the power transfer component and the communications receiver and configured to determine a power loss value based on the group identifier, the power loss value indicative of power loss due to induction heating presented (Continued)

by one or more wireless power receivers that are members of a group associated with the group identifier.

30 Claims, 9 Drawing Sheets

(51) Int. Cl.
    *G01R 29/08* (2006.01)
    *H02J 7/02* (2016.01)
    *G01R 21/01* (2006.01)
    *G01V 3/12* (2006.01)
    *H04B 5/00* (2006.01)
    *H02J 7/00* (2006.01)

(52) U.S. Cl.
    CPC .............. *H02J 7/007* (2013.01); *H02J 7/025* (2013.01); *H04B 5/0037* (2013.01); *H04B 5/0075* (2013.01); *H02J 7/0052* (2013.01)

(56) References Cited

U.S. PATENT DOCUMENTS

| | | |
|---|---|---|
| 9,148,201 B2 | 9/2015 | Kallal et al. |
| 9,331,526 B2 | 5/2016 | Stevens et al. |
| 2007/0228833 A1 | 10/2007 | Stevens et al. |
| 2008/0197712 A1 | 8/2008 | Jin et al. |
| 2009/0127936 A1 | 5/2009 | Kamijo et al. |
| 2010/0070219 A1 | 3/2010 | Azancot et al. |
| 2010/0084918 A1 | 4/2010 | Fells et al. |
| 2011/0196544 A1 | 8/2011 | Baarman et al. |
| 2011/0221388 A1 | 9/2011 | Low et al. |
| 2011/0248727 A1 | 10/2011 | Krumme et al. |
| 2011/0285214 A1 | 11/2011 | Stevens et al. |
| 2012/0068536 A1 | 3/2012 | Stevens et al. |
| 2012/0089039 A1 | 4/2012 | Felix et al. |
| 2012/0146576 A1 | 6/2012 | Partovi |
| 2012/0212071 A1 | 8/2012 | Miyabayashi et al. |
| 2012/0293007 A1 | 11/2012 | Byun et al. |
| 2012/0313579 A1 | 12/2012 | Matsumoto et al. |
| 2012/0326521 A1 | 12/2012 | Bauer et al. |
| 2013/0002038 A1* | 1/2013 | Lee .......................... H02J 7/00 307/104 |
| 2013/0038402 A1 | 2/2013 | Karalis et al. |
| 2013/0076153 A1 | 3/2013 | Murayama et al. |
| 2013/0094598 A1 | 4/2013 | Bastami |
| 2013/0162220 A1 | 6/2013 | Iijima et al. |
| 2013/0200919 A1 | 8/2013 | Fokkelman et al. |
| 2013/0257165 A1 | 10/2013 | Singh |
| 2013/0257168 A1 | 10/2013 | Singh |
| 2013/0285618 A1 | 10/2013 | Iijima et al. |
| 2014/0077617 A1 | 3/2014 | Nakano et al. |
| 2014/0111019 A1 | 4/2014 | Roy et al. |
| 2015/0054453 A1 | 2/2015 | White, II et al. |
| 2015/0054454 A1 | 2/2015 | White, II et al. |
| 2016/0036265 A1* | 2/2016 | Kim ....................... H02J 5/005 320/108 |

OTHER PUBLICATIONS

Kuyvenhoven, N., et al., "Development of a Foreign Object Detection and Analysis Method for Wireless Power Systems," 2011 IEEE Symposium on Product Compliance Engineering (PSES), pp. 1-6.

* cited by examiner

SYSTEMS, APPARATUS, AND METHODS FOR QUANTIFYING POWER LOSSES DUE TO INDUCTION HEATING IN WIRELESS POWER RECEIVERS

CROSS-REFERENCE TO RELATED APPLICATIONS

This application claims the benefit of priority to U.S. Provisional Patent Application No. 61/869,488, entitled "SYSTEMS, APPARATUS, AND METHODS FOR QUANTIFYING POWER LOSSES DUE TO INDUCTION HEATING IN WIRELESS POWER RECEIVERS," filed Aug. 23, 2013, the entirety of which is incorporated herein by reference. This application also claims the benefit of priority to U.S. Provisional Patent Application No. 61/883,920, entitled "APPARATUS AND METHOD FOR LOST POWER DETECTION," filed Sep. 27, 2013, the entirety of which is incorporated herein by reference.

FIELD

The described technology generally relates to wireless power. More specifically, the disclosure is directed to devices, systems, and methods related to quantifying power losses due to induction heating in wireless power receivers.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power, thereby often requiring recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable. In this context, there remains a need for quantifying power losses in wireless power receivers.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the present disclosure provides an apparatus for wireless power transfer. The apparatus comprises a power transfer component configured to transmit wireless power to a wireless power receiver at a power level sufficient to charge or power a load. The apparatus further comprises a communications receiver configured to receive a message from the wireless power receiver, the message comprising a group identifier. The apparatus further comprises a controller circuit operationally coupled to the power transfer component and the communications receiver and configured to determine a power loss value based on the group identifier, the power loss value indicative of power loss due to induction heating presented by one or more wireless power receivers that are members of a group associated with the group identifier.

Another aspect of the present disclosure provides an apparatus for receiving wireless power. The apparatus comprises a power receiving component configured to receive wireless power from a power transfer component at a power level sufficient to charge or power a load of the apparatus. The apparatus further comprises a communications transmitter configured to send a message to a communications receiver, the message comprising a group identifier, wherein the apparatus is a member of a group associated with the group identifier, wherein the group identifier is indicative of a power loss value, the power loss value indicative of power loss due to induction heating presented by one or more wireless power receivers that are members of the group associated with the group identifier.

Another aspect of the present disclosure provides a method for wirelessly transferring power. The method comprises wirelessly transmitting power from a power transfer component to a wireless power receiver at a power level sufficient to charge or power a load. The method further comprises receiving a message from the wireless power receiver, the message comprising a group identifier. The method further comprises determining a power loss value based on the group identifier, the power loss value indicative of power loss due to induction heating presented by one or more wireless power receivers that are members of a group associated with the group identifier.

Another aspect of the present disclosure provides a method for receiving wireless power. The method comprises receiving wireless power from a power transfer component at a power level sufficient to charge or power a load of the device. The method further comprises sending a message to a communications receiver, the message comprising a group identifier, wherein the device is a member of a group associated with the group identifier, wherein the group identifier is indicative of a power loss value, the power loss value indicative of power loss due to induction heating presented by one or more wireless power receivers that are members of the group associated with the group identifier.

Another aspect of the present disclosure provides an apparatus for wirelessly transferring power. The apparatus comprises means for wirelessly transmitting power from a power transfer component to a wireless power receiver at a power level sufficient to charge or power a load. The apparatus further comprises means for receiving a message from the wireless power receiver, the message comprising a group identifier. The apparatus further comprises means for determining a power loss value based on the group identifier, the power loss value indicative of power loss due to induction heating presented by one or more wireless power receivers that are members of a group associated with the group identifier.

Another aspect of the present disclosure provides an apparatus for receiving wireless power. The apparatus comprises means for receiving wireless power from a power transfer component at a power level sufficient to charge or power a load of the device. The apparatus further comprises means for sending a message to a communications receiver, the message comprising a group identifier, wherein the device is a member of a group associated with the group identifier, wherein the group identifier is indicative of a power loss value, the power loss value indicative of power loss due to induction heating presented by one or more wireless power receivers that are members of the group associated with the group identifier.

Another aspect of the present disclosure provides a non-transitory computer readable medium. The medium comprises code that, when executed, causes an apparatus to transmit wireless power to a wireless power receiver at a power level sufficient to charge or power a load. The medium further comprises code that, when executed, causes an apparatus to receive a message from the wireless power receiver, the message comprising a group identifier. The medium further comprises code that, when executed, causes an apparatus to determine a power loss value based on the group identifier, the power loss value indicative of power loss due to induction heating presented by one or more wireless power receivers that are members of a group associated with the group identifier.

Another aspect of the present disclosure provides a non-transitory computer-readable medium. The medium comprises code that, when executed, causes an apparatus to receive wireless power from a power transfer component at a power level sufficient to charge or power a load of the apparatus. The medium further comprises code that, when executed, causes an apparatus to send a message to a communications receiver, the message comprising a group identifier, wherein the apparatus is a member of a group associated with the group identifier, wherein the group identifier is indicative of a power loss value, the power loss value indicative of power loss due to induction heating presented by one or more wireless power receivers that are members of the group associated with the group identifier.

Figure 1:
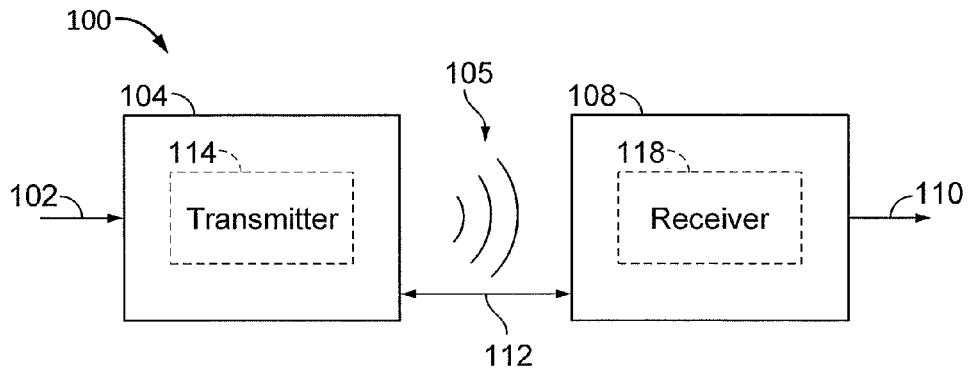
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving antenna" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 105 for providing energy transfer. A receiver 108 may couple to the field 105 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 105 produced by the transmitter 104. The field 105 corresponds to a region where energy output by the transmitter 104 may be captured by a receiver 105. In some cases, the field 105 may correspond to the "near-field" of the transmitter 104 as will be further described below. The transmitter 104 may include a transmit antenna 114 for outputting an energy transmission. The receiver 108 further includes a receive antenna 118 for receiving or capturing energy from the energy transmission. The near-field may correspond to a region in which there are strong reactive fields resulting from the currents and charges in the transmit antenna 114 that minimally radiate power away from the transmit antenna 114. In some cases the near-field may correspond to a region that is within about one wavelength (or a fraction thereof) of the transmit antenna 114. The transmit and receive antennas 114 and 118 are sized according to applications and devices to be associated therewith. As described above, efficient energy transfer may occur by coupling a large portion of the energy in a field 105 of the transmit antenna 114 to a receive antenna 118 rather than propagating most of the energy in an electromagnetic wave to the far field. When positioned within the field 105, a "coupling mode" may be developed between the transmit antenna 114 and the receive antenna 118. The area around the transmit and receive antennas 114 and 118 where this coupling may occur is referred to herein as a coupling-mode region.

Figure 2:
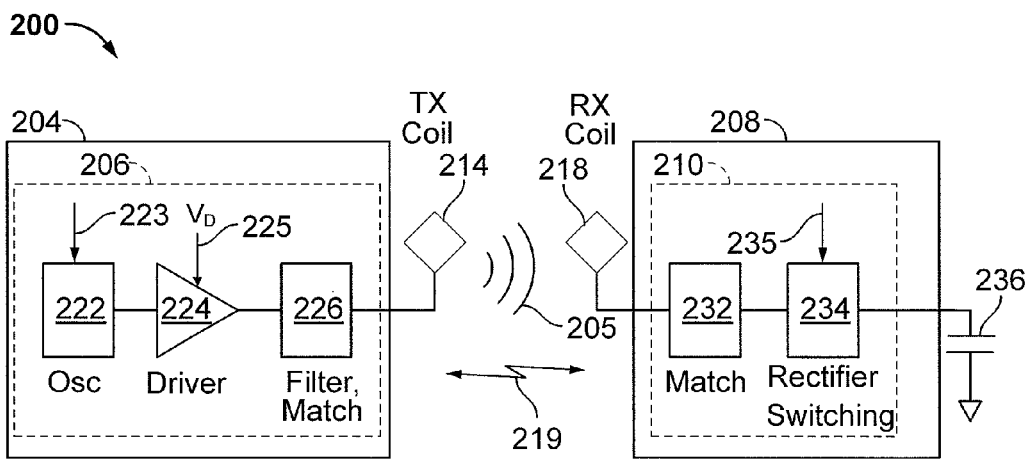
FIG. 2 is a functional block diagram of exemplary components that may be used in the wireless power transfer system of FIG. 1, in accordance with various exemplary embodiments of the invention.

FIG. 2 is a functional block diagram of exemplary components 200 that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, which may be adjusted in response to a frequency control signal 223. The oscillator signal may be provided to a driver circuit 224 configured to drive the transmit antenna 214 at, for example, a resonant frequency of the transmit antenna 214. The driver circuit 224 may be a switching amplifier configured to receive a square wave from the oscillator 222 and output a sine wave. For example, the driver circuit 224 may be a class E amplifier. A filter and matching circuit 226 may be also included to filter out harmonics or other unwanted frequencies and match the impedance of the transmitter 204 to the transmit antenna 214. As a result of driving the transmit antenna 214, the transmitter 204 may wirelessly output power at a level sufficient for charging or power an electronic device. As one example, the power provided may be for example on the order of 300 milliWatts to 5 Watts to power or charge different devices with different power requirements. Higher or lower power levels may also be provided.

The receiver 208 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive antenna 218. The receiver 208 and transmitter 204 may additionally communicate on a separate communication channel 219 (e.g., Bluetooth, zigbee, Wi-Fi, cellular, etc). The receiver 208 and transmitter 204 may alternatively communicate via in-band signaling using characteristics of the wireless field 206.

As described more fully below, receiver 208, that may initially have a selectively disablable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
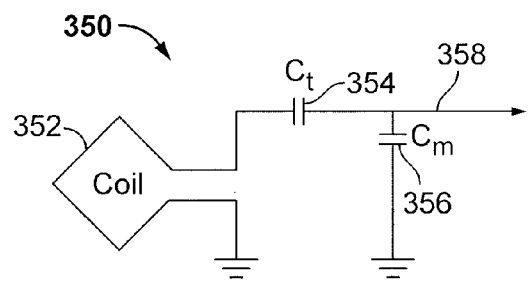
FIG. 3 is a schematic diagram of a portion of transmit circuitry or receive circuitry of FIG. 2 including a transmit or receive antenna, in accordance with exemplary embodiments of the invention.

FIG. 3 is a schematic diagram of a portion of transmit circuitry 206 or receive circuitry 210 of FIG. 2 including a transmit or receive antenna 352, in accordance with exemplary embodiments of the invention. As illustrated in FIG. 3, transmit or receive circuitry 350 used in exemplary embodiments including those described below may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, an antenna 352 is an example of a "power transfer component" of a type that is configured to wirelessly output and/or receive power. The antenna 352 may be configured to include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 105 of the transmit antenna 214 coil to the receive antenna 218 residing in the neighborhood where this field 105 is established rather than propagating the energy from the transmit antenna 214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, capacitor 352 and capacitor 354 may be added to the transmit or receive circuitry 350 to create a resonant circuit that selects a signal 356 at a resonant frequency. Accordingly, for larger diameter antennas, the size of capacitance needed to sustain resonance may decrease as the diameter or inductance of the loop increases. Furthermore, as the diameter of the antenna increases, the efficient energy transfer area of the near-field may increase. Other resonant circuits formed using other components are also possible. As another non-limiting example, a capacitor may be placed in parallel between the two terminals of the antenna 352. For transmit antennas, a signal 358 with a frequency that substantially corresponds to the resonant frequency of the antenna 352 may be an input to the antenna 352.

In one embodiment, the transmitter 104 may be configured to output a time varying magnetic field with a frequency corresponding to the resonant frequency of the transmit antenna 114. When the receiver is within the field 105, the time varying magnetic field may induce a current in the receive antenna 118. As described above, if the receive antenna 118 is configured to be resonant at the frequency of the transmit antenna 118, energy may be efficiently transferred. The AC signal induced in the receive antenna 118 may be rectified as described above to produce a DC signal that may be provided to charge or to power a load.

Figure 4:
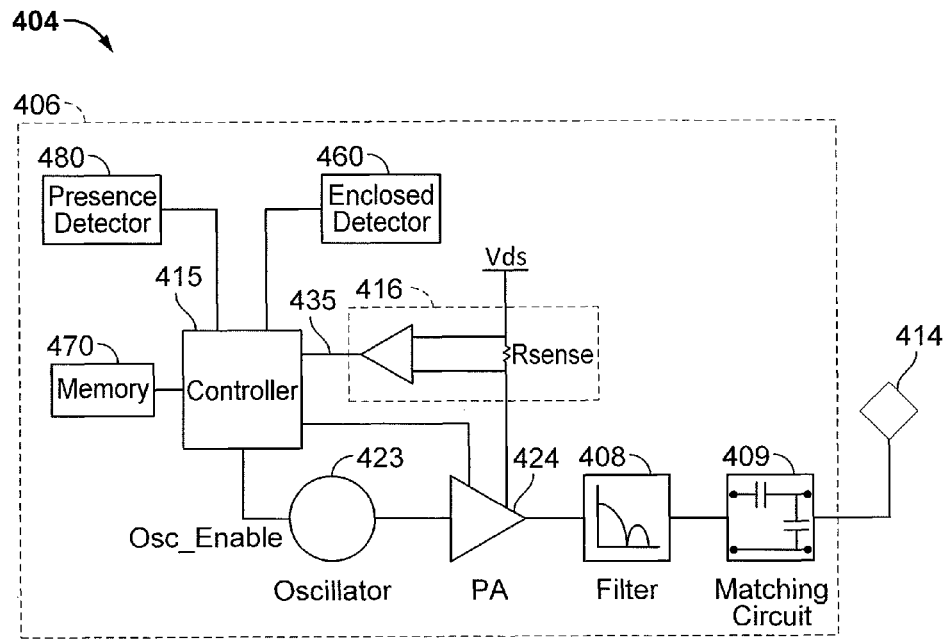
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit antenna 414. The transmit antenna 414 may be the antenna 352 as shown in FIG. 3. Transmit circuitry 406 may provide RF power to the transmit antenna 414 by providing an oscillating signal resulting in generation of energy (e.g., magnetic flux) about the transmit antenna 414. Transmitter 404 may operate at any suitable frequency. By way of example, transmitter 404 may operate at the 6.78 MHz ISM band.

Transmit circuitry 406 may include a fixed impedance matching circuit 409 for matching the impedance of the transmit circuitry 406 (e.g., 50 ohms) to the transmit antenna 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the antenna 414 or DC current drawn by the driver circuit 424. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit antenna 414 may be on the order of 2.5 Watts.

Transmit circuitry 406 may further include a controller 415 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 415 may also be referred to herein as processor 415. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit antenna 414. By way of example, a load sensing circuit 416 monitors the current flowing to the driver circuit 424, that may be affected by the presence or absence of active receivers in the vicinity of the field generated by transmit antenna 414 as will be further described below. Detection of changes to the loading on the driver circuit 424 are monitored by controller 415 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit antenna 414 may be implemented with a Litz wire or as an antenna strip with the thickness, width and metal type selected to keep resistive losses low. In a one implementation, the transmit antenna 414 may generally be configured for association with a larger structure such as a table, mat, lamp or other less portable configuration. Accordingly, the transmit antenna 414 generally may not need "turns" in order to be of a practical dimension. An exemplary implementation of a transmit antenna 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmit circuitry 406 may include a presence detector 480, an enclosed detector 460, or a combination thereof, connected to the controller 415 (also referred to as a processor herein). The controller 415 may adjust an amount of power delivered by the driver circuit 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter 404. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit antenna 414 may transmit at a specific frequency. In some cases, these regulations are meant to protect humans from electromagnetic radiation. However, there may be environments where a transmit antenna 414 is placed in areas not occupied by humans, or occupied infrequently by humans, such as, for example, garages, factory floors, shops, and the like. If these environments are free from humans, it may be permissible to increase the power output of the transmit antenna 414 above the normal power restrictions regulations. In other words, the controller 415 may adjust the power output of the transmit antenna 414 to a regulatory level or lower in response to human presence and adjust the power output of the transmit antenna 414 to a level above the regulatory level when a human is outside a regulatory distance from the electromagnetic field of the transmit antenna 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive antenna 218 that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
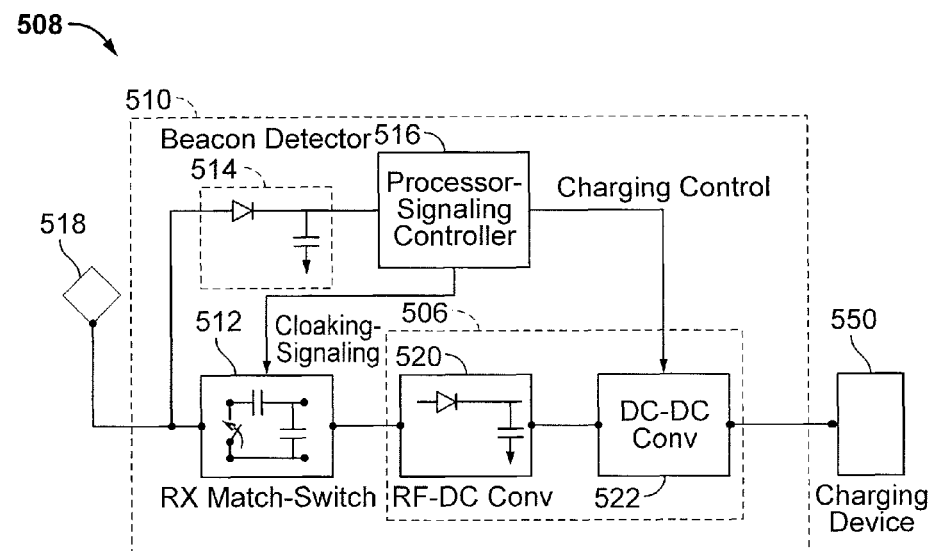
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive antenna 518. Receiver 508 further couples to device 550 for providing received power thereto. It should be noted that receiver 508 is illustrated as being external to device 550 but may be integrated into device 550. Energy may be propagated wirelessly to receive antenna 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (and other medical devices), and the like.

Receive antenna 518 may be tuned to resonate at the same frequency, or within a specified range of frequencies, as transmit antenna 414 (FIG. 4). Receive antenna 518 may be similarly dimensioned with transmit antenna 414 or may be differently sized based upon the dimensions of the associated device 550. By way of example, device 550 may be a portable electronic device having diametric or length dimension smaller that the diameter of length of transmit antenna 414. In such an example, receive antenna 518 may be implemented as a multi-turn coil in order to reduce the capacitance value of a tuning capacitor (not shown) and increase the receive coil's impedance. By way of example, receive antenna 518 may be placed around the substantial circumference of device 550 in order to maximize the antenna diameter and reduce the number of loop turns (i.e., windings) of the receive antenna 518 and the inter-winding capacitance.

Receive circuitry 510 may provide an impedance match to the receive antenna 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 522. RF-to-DC converter 520 rectifies the RF energy signal received at receive antenna 518 into a non-alternating power with an output voltage represented by Vrect. The DC-to-DC converter 522 (or other power regulator) converts the rectified RF energy signal into an energy potential (e.g., voltage) that is compatible with device 550 with an output voltage and output current represented by Vout and Iout. Various RF-to-DC converters are contemplated, including partial and full rectifiers, regulators, bridges, doublers, as well as linear and switching converters.

Receive circuitry 510 may further include switching circuitry 512 for connecting receive antenna 518 to the power conversion circuitry 506 or alternatively for disconnecting the power conversion circuitry 506. Disconnecting receive antenna 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter driver circuit 424. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive antenna 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 522 for improved performance.

Figure 6:
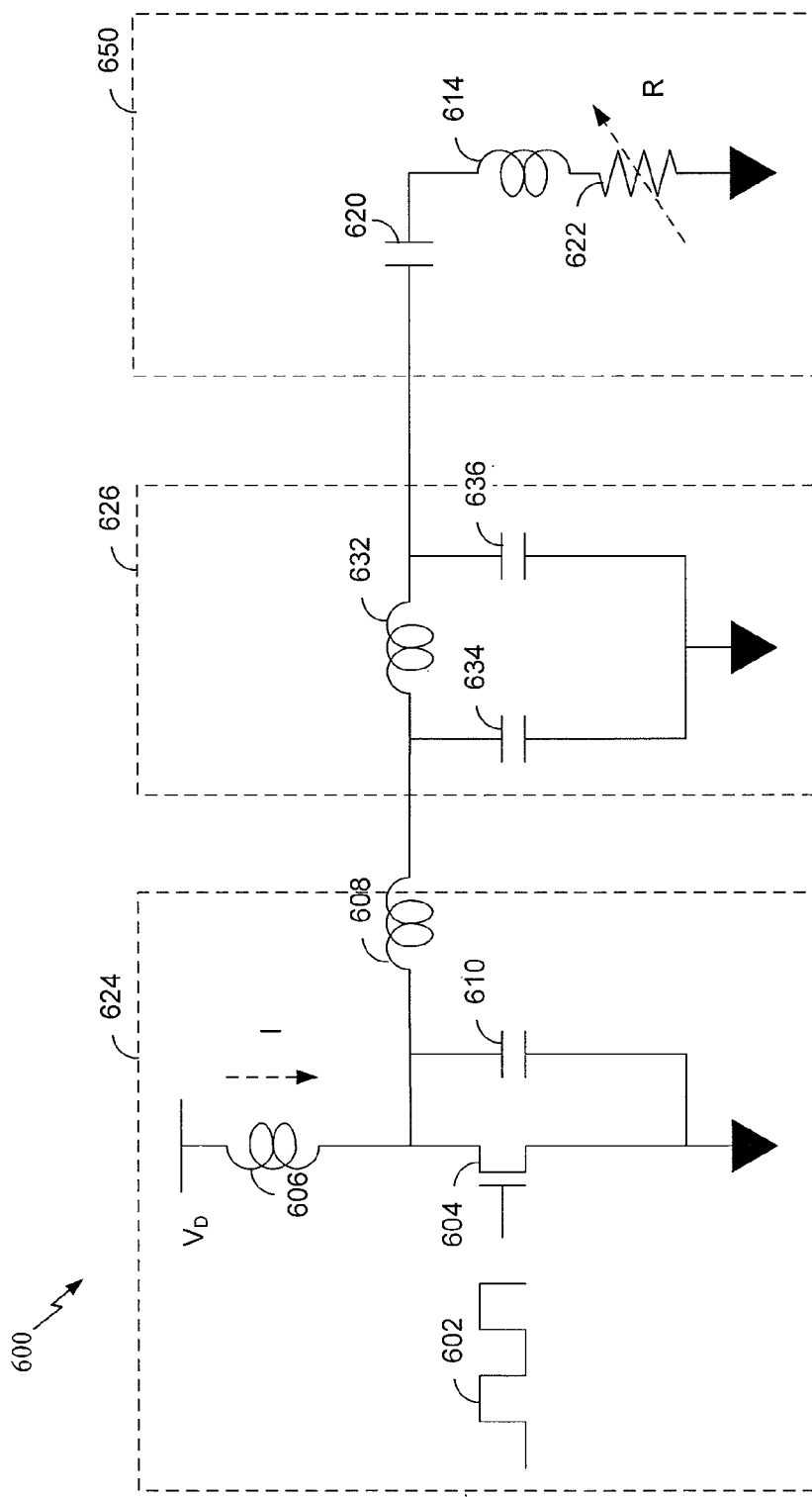
FIG. 6 is a schematic diagram of a portion of transmit circuitry that may be used in the transmit circuitry of FIG. 4, in accordance with exemplary embodiments.

FIG. 6 is a schematic diagram of a portion of transmit circuitry 600 that may be used in the transmit circuitry 406 of FIG. 4. The transmit circuitry 600 may include a driver circuit 624 as described above in FIG. 4. The driver circuit 624 may be similar to the driver circuit 424 shown in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage VD that is configured to control the maximum power that may be delivered through a transmit circuit 650. To eliminate or reduce harmonics, the transmit circuitry 600 may include a filter circuit 626. The filter circuit 626 may be a three pole (capacitor 634, inductor 632, and capacitor 636) low pass filter circuit 626.

The signal output by the filter circuit 626 may be provided to a transmit circuit 650 comprising an antenna 614. The transmit circuit 650 may include a series resonant circuit having a capacitance 620 and inductance (e.g., that may be due to the inductance or capacitance of the antenna or to an additional capacitor component) that may resonate at a frequency of the filtered signal provided by the driver circuit 624. The load of the transmit circuit 650 may be represented by the variable resistor 622. The load may be a function of a wireless power receiver 508 that is positioned to receive power from the transmit circuit 650.

As described above, a loosely coupled wireless power system includes a transmitter 404 and receiver 508. The transmitter 404 creates a magnetic field which couples to the receiver 508 and converts magnetic energy into electrical energy. The receiver 508 is connected to a device to be charged which draws on the electrical energy. As indicated above, the device being charged could be any electronic hardware such as a cellular phone, a computer, a Bluetooth headset, or the like. The transmitter 404 may communicate with any given receiver 508 via a communications links (e.g., Bluetooth, zigbee, Wi-Fi, cellular, or the like). The communication link allows the receiver 508 to send feedback data to the transmitter 404 such that the transmitter 404 may vary the strength of its magnetic field to adjust the electrical energy being transferred. A receiver 508 may be considered "compliant" if it is able to communicate with the transmitter 404 and function according to system control parameters of the transmitter 404.

Since the transmitter 404 creates a magnetic field, electrical energy may be transferred to anything that couples to the magnetic field generated by the transmitter 404. This includes "compliant" receivers and any other "non-compliant" objects. In an aspect, "non-compliant" objects may be considered any object or device that violates the system control parameters or other pre-defined system requirements or features. Some examples may include receivers that fail to satisfy system design or operational requirements, damaged receivers, miscellaneous objects, and the like. For example, any object that is metal or that is capable of coupling to the magnetic field may absorb electrical energy and may be considered a "non-compliant" device. This energy is dissipated in the form of heat which may damage the object, harm the user, damage the transmitter 404, or create other safety issues. Other examples of "non-compliant" objects which couple to magnetic fields are jewelry, key-chains, eye-glasses, other metal objects, and the like. Since the transmitter 404 cannot communicate with these objects, it has no method to regulate or detect the electrical energy consumed by a non-compliant object. Without a non-compliant object detections system, a transmitter 404 may continue transferring power to a non-compliant device indefinitely. This may result in a fire hazard, potential damage to the transmitter 404, and/or a burning hazard to a user that touches a heated object.

In an aspect, objects may be detected, in accordance with one example, by measuring the reactance of load of the transmitter 404 and using consecutive measurements to look for a change. If a large enough reactance shift occurs without a new communication link established, the transmitter 404 may determine that a metal object has been placed within the magnetic field and caused the reactance shift. As no communication link has been established, the transmitter 404 may detect that the object is a non-compliant object. In some aspects, this approach may be less reliable since some non-compliant objects can absorb large amounts of electrical energy without creating any reactance shift. Additionally, a compliant receiver 508 with a dynamic energy demand will cause dynamic reactance shifts that may cause the transmitter 404 to falsely detect a non-compliant object.

Certain aspects described herein are directed to methods and apparatuses for detecting "non-compliant objects." In accordance with certain embodiments, a transmitter 404 may use system measurements taken on both the transmitter 404 and the receiver 508 to determine with high probability if a non-compliant object is present in the magnetic field generated by the transmitter 404, where the non-compliant object is consuming power greater than a specified threshold. In an aspect, the transmitter 404 may compare power measured into the transmitter coil 414, power measured out of the receiver (e.g., from the RF-DC converter 520), and power lost in the system. For example, the transmitter 404 may use a predefined algorithm (e.g., a lost power algorithm, as further described below) to compute various results based on the power comparisons. The difference between the transmitter 404 and receiver 508 measurements while accounting for the losses enable determination of whether a non-compliant object is present and consuming power. In this way, the transmitter 404 may determine an amount of "lost power" or "system power loss." In one example, the amount of system power loss may be further based on a difference between a power level measurement of the transmitter 404 and a power level received by the receiver 508. For example, if the difference between power measured into the transmitter coil 414 and the sum of power consumed by each receiver 508 is positive (e.g., there is lost power), some non-compliant object may be consuming power. For example, the transmitter 404 may consider or factor other potential sources of lost power before determining that a non-compliant object is present, e.g., power consumed by the receiver 508, power delivered to a load of the receiver 508, power dissipated in the receiver 508, etc.

In accordance with an exemplary method, the current and power into the transmitter coil 414 is measured. In addition, the voltage and current out of the receiver rectifier 520 is measured. Unit-unit tolerances and measurement errors are accounted for. Power lost between the transmitter 404 power measurement and the receiver rectifier output is determined. Based on these measurements and taking into account measurements errors and unit-unit tolerances and losses, a non-compliant object may be detected as present and consuming power.

In accordance with an aspect, a receiver 508 may transmit to a transmitter 404 a message that indicates an amount of power dissipated by the receiver 508. In one aspect, an amount of power dissipated may represent a percentage of a receiver's power dissipated by a receive resonator to the RF-DC converter 520 (e.g. to the output of a diode of a rectifier).

In accordance with another aspect of an embodiment, receiver measurements pertaining to power loss determinations may be updated or remain valid within a specified time delay. For example, values such as the voltage at output of a rectifier ($V_{rect}$) or the current at the output of a rectifier ($I_{rect}$) may be updated or known to be valid during a period of time preceding some reporting interval. Measurements of $V_{rect}$ and $I_{rect}$ may be made within a certain period of time of each other (e.g., taken within 1 ms of each other). This may allow for responding to rapid dynamic load changes (for example as the device to be charged rapidly changes its power consumption).

As described above, when comparing power transmitted to power received, the transmitter 404 takes into account various system power losses. For example, when metal (e.g., a metallic object in an open-circuit receiver 508) is introduced into the magnetic field generated by a transmitter 404, eddy currents may be created, which may cause a given receiver 508 to dissipate power in the form of heat in the metal (e.g., hereinafter referred to as induction heating). The amount of power dissipated in the metal object may depend on several factors: the size/shape of the object, the strength of the magnetic field, and the design of the transmitter resonator. Each of these variables may be different for any given transmitter 404 charging any given receiver 508. The power dissipated also varies depending on the location of the receiver on the transmitter. Therefore, in accordance with embodiments described herein, to quantify how much power is being lost, a system may determine or quantify how much power is lost to induction heating despite each of these variables. For example, the transmitter 404 may take into account induction heating losses for each compliant receiver into the lost power calculation.

In an aspect, the power lost to induction heating may be modeled as a resistor, which in one approach may be considered to be in series with (e.g., a function of) the transmitter 404 coil resistance. For example, a receiver 508 with a large model resistor value may dissipate more power than a receiver 508 with a smaller model resistor value. The resistor value may be referred to herein as the resistor value, the resistor, the power loss resistance, the power loss resistance value, a variable (e.g., deltaR1), or the like. The resistor value may be used to indicate/derive the amount of power loss from induction heating in a receiver 508. In one aspect, the power loss resistance may be calculated by the controller 415. The resistor value may be "variable," such that a resistor value range may be established to represent minimum and maximum resistor values. For example, the resistor value may vary based on location of the receiver 508 with respect to the transmitter 404 as well as varying from one receiver 508 design to another. Furthermore, the resistor value may vary from one transmitter 404 to another. For example, as associated with a first transmitter, the receiver 508 may indicate a resistor value ranging from about 0.4Ω to about 0.7Ω. Whereas associated with a second transmitter, receiver 508 may indicate a resistor value ranging from about 0.05Ω to about 0.1Ω. It may be understood that all numerical examples are for exemplary purposes only.

As such, in accordance with an embodiment, a receiver 508 is configured to transmit a message indicating the impact of the receiver 508 on induction heating losses to a transmitter 404. The message may include information indicating the power loss resistance that may correspond to a change in the measured resistance of a transmitter resonator when a receiver is placed to receive power from the transmitter with an open-circuit resonator. In accordance with an embodiment, the receiver 508 may send, to a transmitter 404, a group identifier that indicates that the receiver 508 belongs to a group of receivers. The group of receivers may correspond to receivers with power loss resistances (e.g., a maximum power loss resistance that will be presented by a receiver) that are within a defined range (as mentioned above), for example, as measured in ohms. For example, a first group may define receivers with power loss resistances of between about 0Ω and about 0.25Ω, while a second group may define receivers with power loss resistances of between about 0Ω and about 1.75Ω. It is appreciated that a defined range may be any range such as, but not limited to, any range between about 0Ω and about 10Ω. If the induction resistance amount is unknown, the receiver 508 may send a message indicating an unknown value. In this case, the transmitter 404 may determine to disable any lost power detection.

Transmitting a group identifier of a group of receivers (rather than for example a specific value for each receiver) may provide certain benefits. In one aspect, it may be difficult for a receiver 508 to dynamically determine its power loss resistance on a transmitter and constantly transmit this value as the receiver 508 is re-positioned and or placed relative to different transmitters having different designs. In one aspect, the power loss resistance may vary significantly based on both the receiver 508 and the transmitter 404. The receiver 508 may be able to accurately report its own influence, but it may not be able to account for changes caused by the transmitter 404 in some aspects. Transmitting a group identifier may allow several different transmitters with different configurations to know how to respond to each type of receiver 508. For example, a receiver 508 belonging to a first group may cause a range of between about 0Ω and about 2Ω of power loss resistance on a first class of transmitter 404, but a range of between about 0Ω and about 1Ω power loss resistance on a second class of transmitter 404. By using a group identifier, different types of transmitters may be able to derive information that determines different power loss resistances a receiver causes to each transmitter. Each group may be defined by testing a given receiver 508 to a pre-defined transmitter 404 design. This is described in further details below.

In accordance with an aspect of an embodiment, the transmitter 404 may not account for every possible power loss resistance value as a receiver 508 is moved relative to the position of the transmitter 404 (e.g., around the surface of the transmitter 404). Instead, as mentioned above, the transmitter 404 may use a maximum power loss resistance value reported or presented by a receiver 508 to quantify the maximum possible power lost (e.g., to the metal of the receiver 508) given a system operating point.

In accordance with an embodiment, each receiver 508 sends or reports an indication of a certain group (e.g., a power loss resistance group) corresponding to ranges of power loss resistance values. In one example, each receiver 508 may use a transmission packet field or the like for reporting an indication of a certain group (e.g., a group identifier). In one aspect, each receiver 508 may report the group with the lowest maximum power loss resistance value, while maintaining compliance with the group specifications, as further described below. Each power loss resistance group may restrict the range of possible power loss resistance values for each transmitter. For example, the power loss resistance presented by all "group 1" receivers may be defined to be between a certain range (e.g., from about 0Ω to about 1.5Ω) for a first transmitter 404 and to be between a different range (e.g., from about 0Ω to about 0.7Ω) for a second transmitter. In one aspect, the minimum power loss resistance for each group may be defined to be about 0Ω for all transmitters, such that a receiver 508 may be prevented from being forced to increase its induction heating.

For existing transmitter resonators, power loss resistance groups may be defined based on a pre-determined existing resonator design. In one aspect, existing receivers may each fall into one of a plurality of predefined groups, each comprising a range of resistance values. For example, each group in a plurality of groups may comprise a minimum power loss resistance value of zero. Each group may also comprise a different maximum power loss resistance value, e.g., ranging from about 0.05Ω to about 10Ω, in one example. In another aspect, each transmitter 404 may define a maximum allowable power loss resistance value for each of a plurality of groups, e.g., in a table.

Figure 7:
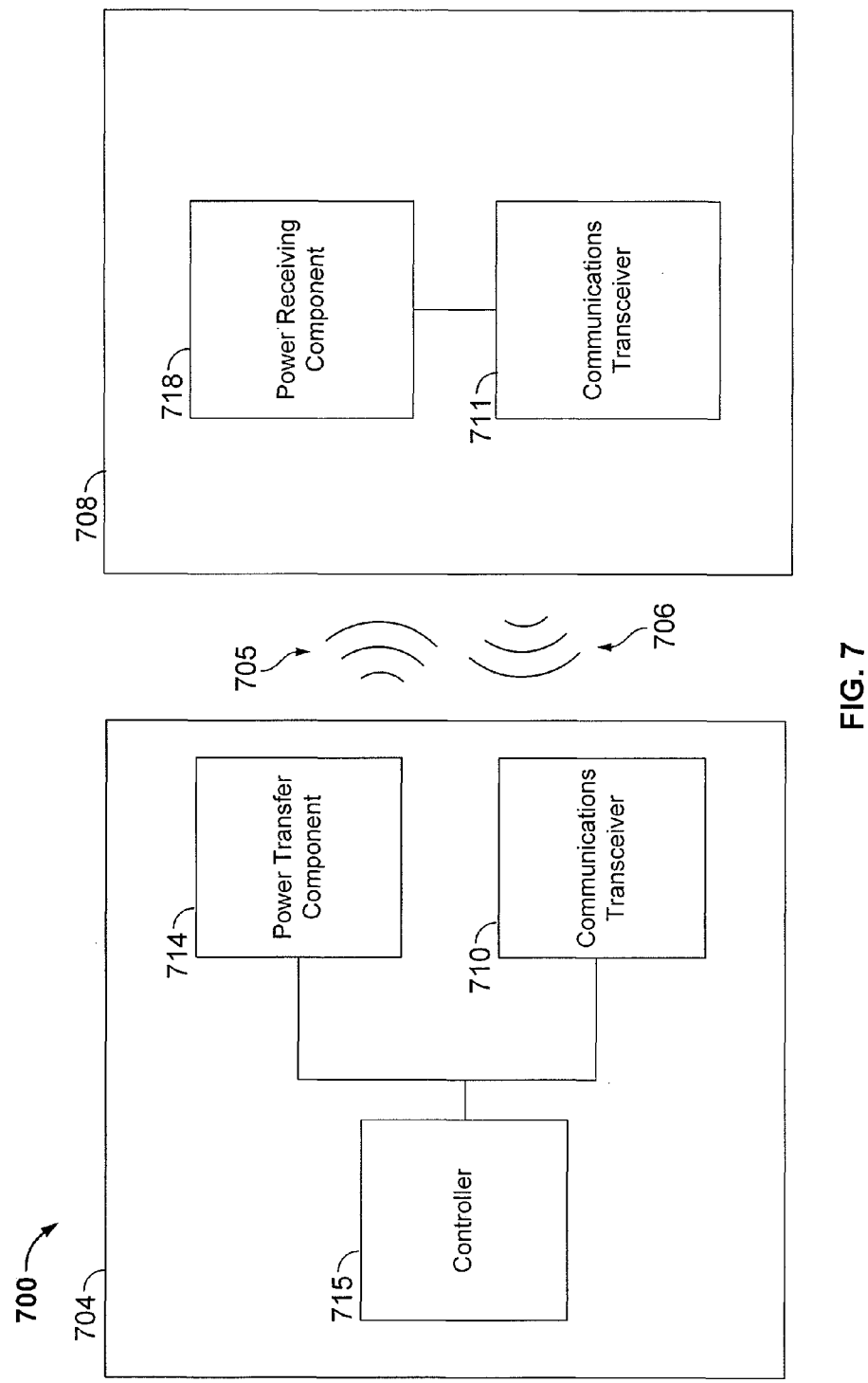
FIG. 7 is a functional block diagram of a first apparatus for wireless power transfer and a second apparatus for receiving wireless power in accordance with exemplary embodiments of the present invention.

With reference to FIG. 7, there is provided a functional block diagram 700 of a first apparatus 704 (e.g., a transmitter, such as the transmitter 404 of FIG. 4) for wireless power transfer and a second apparatus 708 (e.g., a wireless power receiver such as the receiver 508 of FIG. 5) for receiving wireless power in accordance with aspects of the present disclosure. The first apparatus 704 may include a power transfer component 714, a first communications transceiver 710, and a controller circuit 715 (e.g., the controller 415 of FIG. 4) operationally coupled to the power transfer component 714 and the communications transceiver 710. It is noted that a separate communications receiver and communications transmitter may be used in lieu of the communications transceiver 710. In one embodiment, the power transfer component 714 may comprise an antenna, e.g., the antenna 414 of FIG. 4 or the like. The power transfer component 714 may transmit wireless power 705 to the wireless power receiver 708 at a power level sufficient to charge or power a load of the wireless power receiver 708. As one example, the power transfer component 714 may be a coil configured to generate an alternating magnetic field for transferring power to the wireless power receiver 708.

The wireless power receiver 708 may include a power receiving component 718. In one embodiment, the power receiving component 718 may comprise an antenna, e.g., the antenna 518 of FIG. 5 or the like. In one aspect, the power receiving component 718 may receive the wireless power 705 from the power transfer component 714 at a power level sufficient to charge or power the load of the wireless power receiver 708.

The wireless power receiver 708 may further include a communications transceiver 711. It is noted that a separate communications receiver and communications transmitter may be used in lieu of the communications transceiver 711. The communications transceiver 711 may be configured to send a message 706 to the first communications transceiver 710. In one embodiment, the message 706 may comprise a group identifier. In one aspect, the wireless power receiver 708 may be associated with the group identifier. In one aspect, the group identifier may be associated with a predefined list of groups, each group comprising a range of resistance values. In one aspect, the group identifier may be stored in a firmware and/or a software of the wireless power receiver 708. In another aspect, there may be a plurality of wireless power receivers 708, and each of the wireless power receivers 708 may send a message comprising a group identifier associated with the wireless power receiver 708. In yet another aspect, the controller circuit 715 may then aggregate power loss values (e.g., as further described below) of each of the plurality of messages based on the group identifiers therein. For example, the controller circuit 715 may determine a total amount of power loss due to induction heating caused by the plurality of wireless power receivers 708 based on the plurality of messages. In another example, in addition to the group identifier, the message 706 may also comprise a maximum resistance value.

As further described above and below, the controller circuit 715 may be configured to determine a power loss value based on the group identifier. In one example, the power loss value may be indicative of power loss due to induction heating presented by one or more wireless power receivers (e.g., the wireless power receiver 708) that are members of a group associated with the group identifier. In another example, the power loss value may be further indicative of an increase in a series resistance of the power transfer component 714 caused by metallic objects in the wireless power receiver 708. In another aspect, the power loss due to induction heating may be indicative of an amount of power dissipated in the wireless power receiver 708 due to the induction heating. In one example, the controller circuit 715 may determine if the power loss value exceeds a threshold value. If the power loss value exceeds the threshold value, the controller circuit 715 may reduce a power level of the apparatus 704 or disable the apparatus 704.

For example, using the methods as described in connection with FIGS. 6-11, the controller circuit 715 may determine, based at least in part on the received group identifier, that the wireless power receiver 708 belongs to a particular power loss resistance group. In one example, the controller 715 may not determine an exact power loss resistance value of the wireless power receiver 708. However, based on the particular power loss resistance group, the controller circuit 715 may determine that the power loss resistance value of the wireless power receiver 708 will not exceed a maximum power loss resistance limit as defined by the particular group. As one example, the controller circuit 715 may determine a maximum induction heating dissipation for a given wireless power receiver 708 will not exceed a particular value as calculated by Equation 1 provided below.

In one exemplary approach, $I_{Tx}^2 * \text{Delta}_{R1_{Max}} = \text{Diss}_{Max}$ (Equation 1), where $I_{Tx}$ represents a current into a coil of the first apparatus 704, $\text{Delta}_{R1_{Max}}$ represents a maximum resistance value associated with the group identifier (e.g., a maximum value of a range of resistance values), and $\text{Diss}_{Max}$ represents a maximum induction heating dissipation value for a given wireless power receiver 708.

Although the actual induction heating dissipation for the wireless power receiver 708 may not reach the level of $Diss_{Max}$, the controller circuit 715 may use $Diss_{Max}$ in various lost power algorithms or calculations, such that it may account for the worst-case scenario of power lost. In one example, this may create a theoretical "excess power," representing the difference between $Diss_{Max}$ and the actual induction heating dissipation, such that a foreign object may consume the excess power. In other words, the excess power may represent the allowable foreign power consumption as a result of system uncertainties in the induction heating dissipation, in addition to other potential system uncertainties increasing the total allowable foreign power consumption. In one aspect, the foreign object may consume the excess power when the controller circuit 715 uses an absolute lost power algorithm as opposed to a delta-based lost power algorithm.

In one illustrative example of the excess power, the wireless power receiver 708 may belong to a particular group with a $Delta_{R1_{Max}}$ of 1 ohm. As associated with a particular transmitter (e.g., the transmitter 404 of FIG. 4), the actual power loss resistance value of this particular wireless power receiver 708 may vary between about 0.1Ω and about 0.7Ω. This actual resistance variance may depend on the position at which the wireless power receiver 708 is associated with the transmitter 404. For simplicity, there may be three positions at which the wireless power receiver 708 may be associated with the transmitter 404, each causing a different actual power loss resistance value. Furthermore, as described above, the transmitter 404 may have a varying $I_{Tx}$ value. This scenario is illustrated below in Table 1, where for simplicity, two $I_{Tx}$ values are considered, both for each of the three wireless power receiver 708 positions. The table further illustrates actual induction heating (for demonstrative purposes), $Diss_{Max}$ (as calculated by Equation 1), and the amount of potential "excess power," which represents a difference between $Diss_{Max}$ and the actual induction heating value.

TABLE 1

Example excess power calculation for a given receiver as associated with a given transmitter as varied by receiver position, transmitter coil current, actual power loss resistance, and actual induction heating

| Receiver Position # | Actual Power Loss Resistance Value (Ω) | $Delta_{R1_{Max}}$ (Ω) | $I_{Tx}$ (Arms) | Actual Induction Heating (W) | $Diss_{Max}$ (W) | "Excess Power" (W) |
|---|---|---|---|---|---|---|
| 1 | 0.1 | 1 | 0.55 | 0.03 | 0.30 | 0.27 |
| 1 | 0.1 | 1 | 1.00 | 0.10 | 1.00 | 0.90 |
| 2 | 0.4 | 1 | 0.55 | 0.12 | 0.30 | 0.18 |
| 2 | 0.4 | 1 | 1.00 | 0.40 | 1.00 | 0.60 |
| 3 | 0.7 | 1 | 0.55 | 0.21 | 0.30 | 0.09 |
| 3 | 0.7 | 1 | 1.00 | 0.70 | 1.00 | 0.30 |

Figure 8:
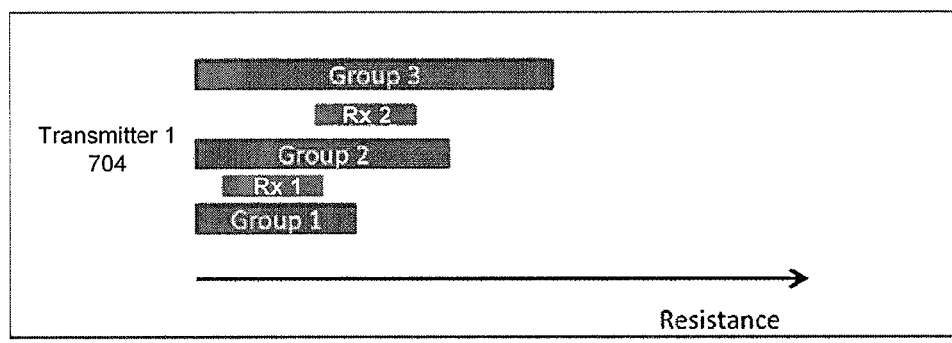
FIG. 8 is a diagram that illustrates how power loss resistance groups may be defined for different wireless power transmitters.

FIG. 8 is a diagram that illustrates how power loss resistance groups (which may also be referred to as "groups") may be defined for different wireless power transmitters (e.g., the transmitter 404 of FIG. 4), as mentioned above. In one example, each group of a first transmitter 704 defines a different range of power loss resistance values, each including a different maximum power loss resistance value. Existing receivers, Rx 1 and Rx 2, fall into group 1 and group 2, respectively. As such, the first transmitter 704 has a power loss resistance limit for each group (e.g., the maximum power loss resistance value). To qualify as a "group 1" receiver, a receiver 508 must not exceed that group's power loss resistance limit on any transmitter 404 (e.g., first transmitter 704 and/or any other transmitter configuration). An example breakdown of each group's limit (e.g., the maximum power loss resistance value) on a single transmitter (e.g., the first transmitter 704) may be as follows:

TABLE 2

Example maximum power loss resistance values based on power loss resistance group

| Power Loss Resistance Group | Maximum Power Loss Resistance Value |
|---|---|
| Group 1 | 0.5 ohms |
| Group 2 | 1 ohms |
| Group 3 | 2 ohms |

When introducing a new transmitter resonator into the system, the power loss resistance ranges may be characterized for existing receivers, as further described in connection with FIG. 9.

Figure 9:
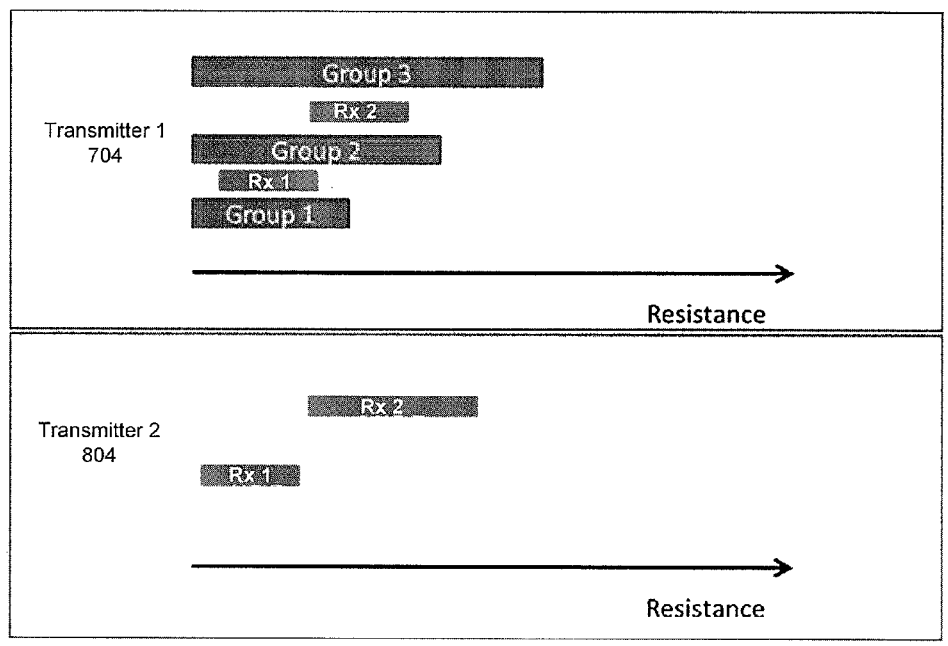
FIG. 9 is a diagram that illustrates how the power loss resistance group ranges are characterized for the existing receivers as described above with reference to FIG. 8 for a second transmitter.

FIG. 9 is a diagram that illustrates how the power loss resistance group ranges are characterized for the existing receivers (e.g., Rx 1 and Rx 2) as described above with reference to FIG. 8 for a second transmitter 804 (e.g., "Transmitter 2"). As described above, maximum power loss resistance value limits may be defined for each receiver (e.g., Rx 1 and Rx2) for each existing power loss resistance group (e.g., Groups 1-3 of FIG. 8). The group limits for the second transmitter 804 may be defined such that the existing receivers, Rx 1 and Rx 2, qualify for their respective groups as associated with a different transmitter (e.g., the transmitter 1 704). In other words, receivers (e.g., Rx 1 and Rx 2) may first be configured to report as certain groups (e.g., Groups 1-3) in connection with a first transmitter (e.g., Transmitter 1 704), as described in connection with FIG. 8. Subsequently, the group limits on a new transmitter (e.g., Transmitter 2 804) may be adjusted such that they accommodate the groups that the receivers (e.g., Rx 1 and Rx 2) are already configured to transmit, as further described in connection with FIG. 10 below. For example, as shown, the power loss resistance presented by Rx 1 to the second transmitter 804 is substantially similar to the power loss resistance presented by Rx 1 to the first transmitter 804. As such, the range of group 1 for both first and second transmitters 704 and 804 may potentially be defined substantially similarly. However, the power loss resistance presented by Rx 2 to the second transmitter 804 is different than the power loss resistance presented by Rx 2 to the first transmitter 704. In this example, the resistance range for group 2 is defined differently for the second transmitter 804 as compared to the resistance rage for group 2 as defined by the first transmitter 704. As a result, Rx 2 may continue to report 'group 2' to each transmitter 704 and 804, but each transmitter 704 and 804 may use a different power loss resistance value for determining overall power loss calculations as described above in connection with FIG. 6.

Figure 10:
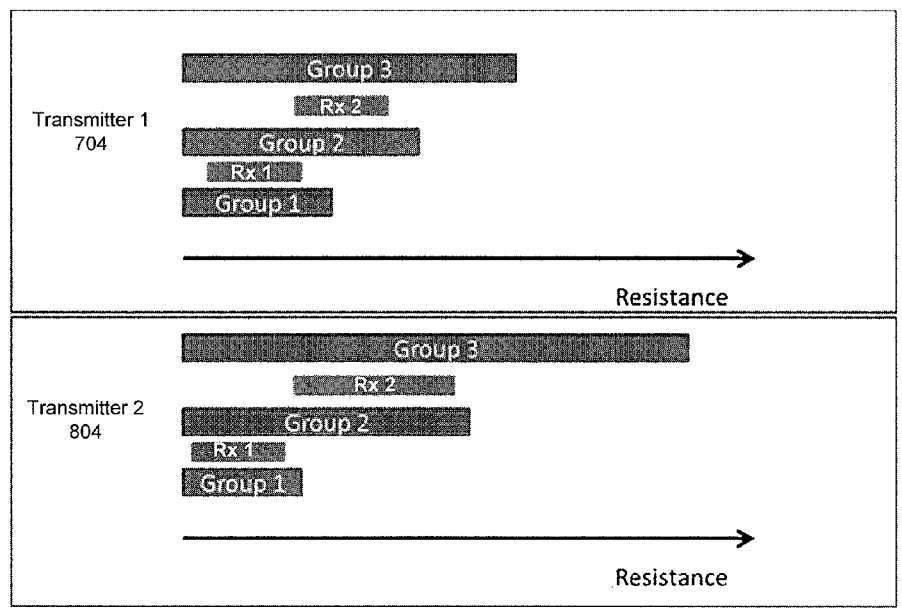
FIG. 10 is a diagram that illustrates how the new power loss resistance group definitions are provided for the second transmitter, as described in connection with FIG. 9.

FIG. 10 is a diagram that illustrates how the new power loss resistance group definitions are provided for the second transmitter 804, as described in connection with FIG. 9. To qualify as a "group 1" receiver (e.g., the receiver 508 of FIG. 5), the receiver 508 may not exceed group 1's maximum power loss resistance value limit on either of the first transmitter 704 or the second transmitter 804. As described above, power loss resistance group range definitions may be adjusted for the second transmitter 804. In one example, this may allow existing receivers 508 to report their previously defined groups while accommodating for a difference in power loss resistance values the receivers may report to the second transmitter 804 as compared to the first transmitter 704. An example comparison of each group's limit (e.g., the maximum power loss resistance value) on each of the transmitters (e.g., the first transmitter 704 and the second transmitter 804) may include:

TABLE 3

Example comparison of each group's maximum power loss resistance values on each of the transmitters

| Power Loss Resistance Group | Maximum Power Loss Resistance Value on Transmitter 1 704 | Maximum Power Loss Resistance Value on Transmitter 2 804 |
|---|---|---|
| Group 1 | 0.5 ohms | 0.3 ohms |
| Group 2 | 1 ohms | 1.5 ohms |
| Group 3 | 2 ohms | 3.5 ohms |

When a new receiver resonator design is introduced, the receiver 508 may determine a receiver group to declare and report. In this case, the receiver 508 may determine a group to report such that its power loss resistance does not exceed the limits for the associated group on any existing transmitter resonator. This is further described below in connection with FIG. 11.

Figure 11:
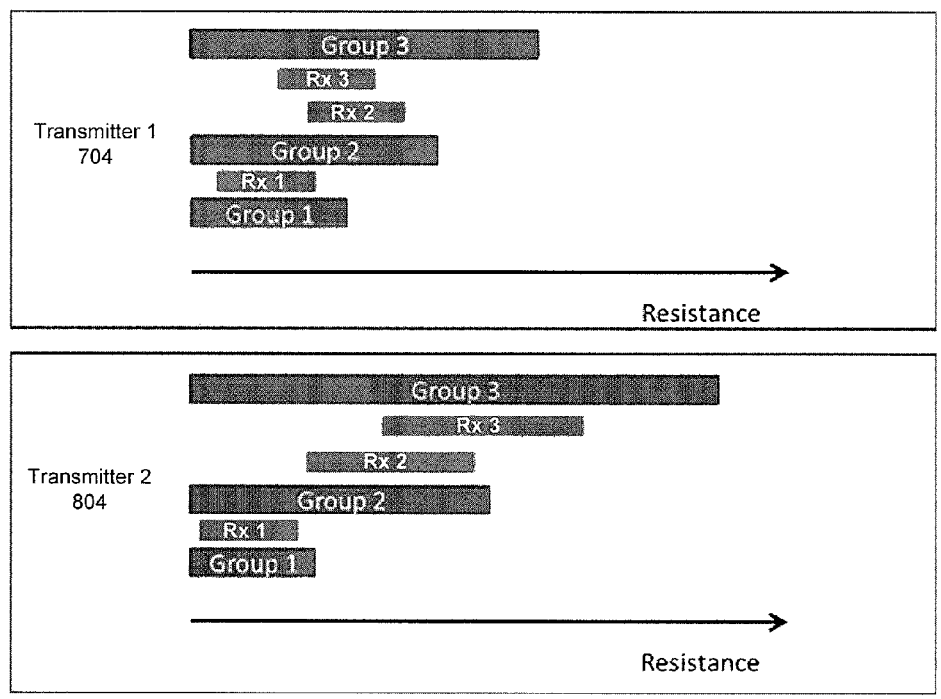
FIG. 11 is a diagram illustrating a new receiver that determines the power loss resistance group that it will report to a transmitter based on the power loss resistance presented to each existing transmitter.

FIG. 11 is a diagram illustrating a new receiver (e.g., a receiver 508), Rx3, that determines the power loss resistance group that it will report to a transmitter (e.g., the Transmitter 1 704 and/or the Transmitter 2 804) based on the power loss resistance presented to each existing transmitter (e.g., as described in connection with FIGS. 6-10). In this example, as shown, in association with the first transmitter 704, the maximum power loss resistance value for Rx 3 does not exceed the maximum power loss resistance limits for group 2. Thus, in this example, Rx 3 may qualify as a group 2 receiver in connection with the first transmitter 704. However, in association with the second transmitter 804, the maximum power loss resistance value for Rx 3 exceeds the pre-defined limit for group 2 as defined by the second transmitter 804. In some examples, a receiver (e.g., Rx 3) may report the same power loss resistance group to all transmitters (e.g., the first transmitter 704 and the second transmitter 804). In one example, the same power loss resistance group may comprise the group including the highest maximum power loss resistance value with which the receiver qualifies. Therefore, in this example, the Rx 3 may report to all transmitters that it belongs to group 3.

In accordance with another embodiment for taking into account power loss resistance, a transmitter 404 may take a power measurement while in a low power beacon mode (e.g., low power mode that periodically transmits power at a low level for receiver detection) and store the real power measured in its memory. When a receiver 508 establishes a connection with the transmitter 404, before enabling the output, the receiver 508 may take another power measurement and compare it with the stored value. The difference may be used to find the power loss resistance value for the receiver 508. Thus, this may allow the transmitter 404 to calculate the power loss resistance value of the receiver 508 when it comes in contact with the transmitter 404 (e.g., when the receiver 508 is placed down onto the transmitter 404).

In accordance with yet another embodiment, every transmitter 404 and receiver 508 (e.g., each platform) may be assigned a unique serial number. In one example, the unique serial number may comprise 4-digits. In that example, up to 9,999 transmitter 404 platforms and 9,999 receiver 508 platforms may be uniquely identified. The unique serial number may allow every transmitter 404 and receiver 508 to communicate the maximum power loss resistance value of the associated receiver 508 to the associated transmitter 404.

In one example, a new transmitter 404 may be assigned a serial number when being introduced to the system. Any existing receiver 508 maximum power loss resistance values may then be measured on the new transmitter 404 and stored in a table. An example table generated from this process is illustrated in Table 4 below. In one aspect, the table may be stored in a memory of the transmitter 404.

TABLE 4

Example maximum power loss resistance value per receiver based on receiver serial number

| Receiver Serial Number | Receiver Maximum Power Loss Resistance Value |
|---|---|
| 00-01 | 0.5 Ω |
| 00-02 | 1.2 Ω |
| . . . | . . . |
| 99-99 | 1 Ω |

In another example, a new receiver 508 connects to a transmitter 404, and the transmitter 404 reports its serial number to the receiver 508. The receiver 508 may attempt to match the reported transmitter serial number with one in its table (e.g., as stored in its NVRAM). An example of such table is illustrated in Table 5. If the receiver 508 finds a match, the receiver 508 may reports the maximum power loss resistance value associated with the serial number. If no match is found, the receiver 508 may report its serial number to the transmitter 404. The transmitter 404 may then match the receiver's serial number with one in its table and use the associated maximum power loss resistance value accordingly.

TABLE 5

Example maximum power loss resistance value per receiver based on transmitter serial number

| Transmitter Serial Number | Receiver Maximum Power Loss Resistance Value |
|---|---|
| 00-01 | 0.6 Ω |
| 00-02 | 1.1 Ω |
| . . . | . . . |
| 99-99 | 1.1 Ω |

Figure 12:
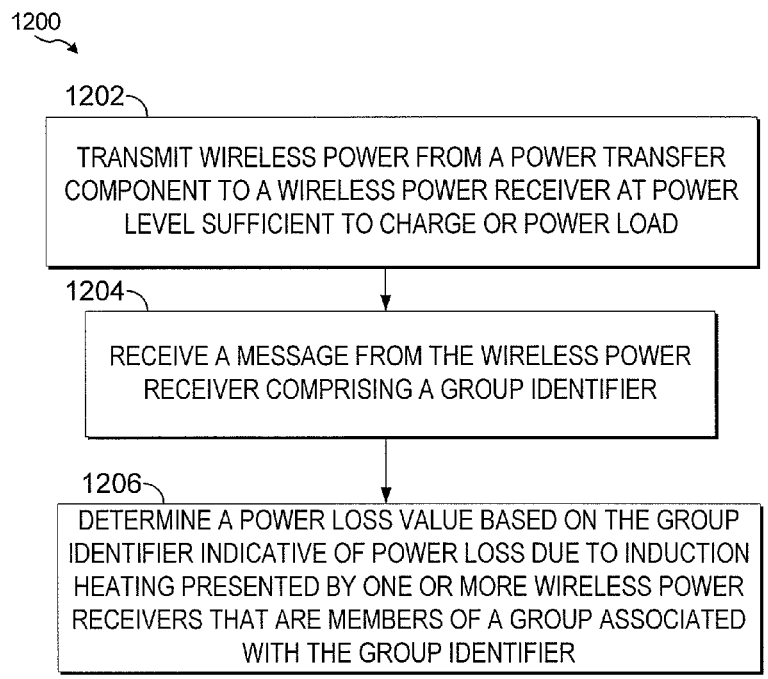
FIG. 12 is a flow chart of an exemplary method for wireless power transfer, in accordance with an exemplary embodiment of the invention.

In accordance with yet another embodiment, if the sum of a plurality of receivers 508 does not correspond with a measured actual resistance value of two devices, the system may FIG. 12 is a flow chart of an exemplary method 1200 for wireless power transfer, in accordance with an exemplary embodiment of the invention. At block 1202, power is wirelessly transmitted from a power transfer component to a wireless power receiver at a power level sufficient to charge or power a load. At block 1204, a message is received from the wireless power receiver, the message comprising a group identifier. At block 1206, a power loss value is determined based on the group identifier, the power loss value indicative of power loss due to induction heating presented by one or more wireless power receivers that are members of a group associated with the group identifier.

Figure 13:
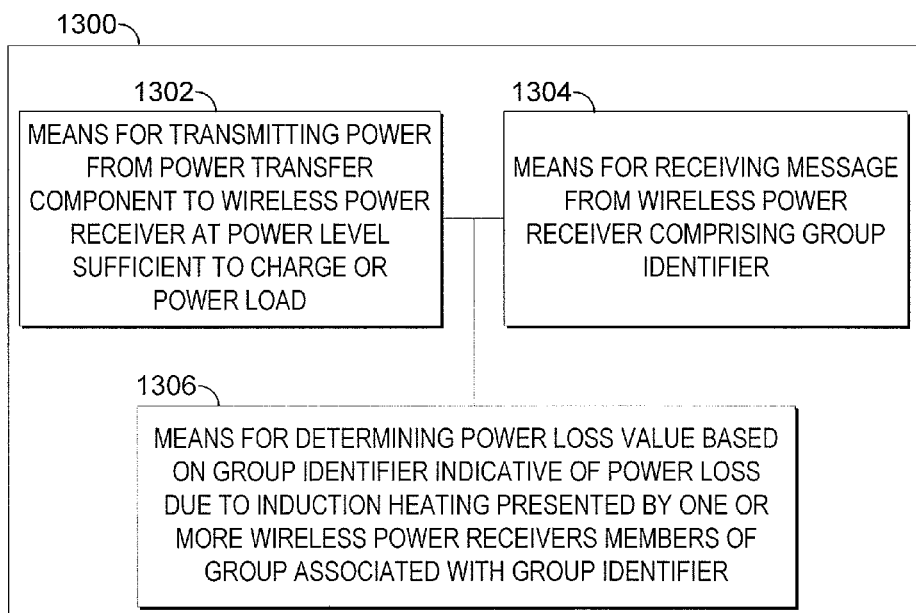
FIG. 13 is a functional block diagram of an apparatus for wireless power transfer, in accordance with an exemplary embodiment of the invention.

FIG. 13 is a functional block diagram of an apparatus 1300 for wireless power transfer, in accordance with an exemplary embodiment of the invention. The apparatus comprises means 1302, 1304, and 1306 for the various actions discussed with respect to FIGS. 1-12.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. For example, a means for wirelessly transmitting power from a power transfer component to a wireless power receiver at a power level sufficient to charge or power a load may comprise a power transfer component and/or a power transfer component coil. In addition, means for receiving a message from the wireless power receiver, the message comprising a group identifier may comprise a communications receiver. In addition, means for determining a power loss value based on the group identifier, the power loss value indicative of power loss due to induction heating presented by one or more wireless power receivers that are members of a group associated with the group identifier may comprise a processor and/or a controller circuit operationally coupled to the power transfer component and the communications receiver.

As another example, a means for receiving wireless power from a power transfer component at a power level sufficient to charge or power a load of the device may comprise a power receiving component. In addition, means for sending a message to a communications receiver, the message comprising a group identifier, wherein the device is a member of a group associated with the group identifier, wherein the group identifier is associated with a predefined list of groups, each group associated with a range of resistance values may comprise a communications transmitter.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for wireless power transfer, the apparatus comprising:
   a power transfer component configured to transmit wireless power to a wireless power receiver at a power level sufficient to charge or power a load;
   a communications receiver configured to receive a message from the wireless power receiver, the message comprising a group identifier; and
   a controller circuit operationally coupled to the power transfer component and the communications receiver and configured to determine a power loss value based on the group identifier, the power loss value indicative of power loss due to induction heating presented by one or more wireless power receivers that are members of a group associated with the group identifier.

2. The apparatus of claim 1, wherein the power loss value is further indicative of an increase in a series resistance of the power transfer component caused by metallic objects in the wireless power receiver.

3. The apparatus of claim 1, wherein the power loss due to induction heating is indicative of an amount of power dissipated in the receiver due to the induction heating.

4. The apparatus of claim 1, wherein the power loss value is further indicative of a maximum power loss due to induction heating and is based at least in part on a current into a coil of the power transfer component.

5. The apparatus of claim 1, wherein the group identifier is associated with a maximum resistance value indicative of the power loss value, wherein the maximum resistance value is a maximum value of a range of resistance values associated with the group identifier.

6. The apparatus of claim 5, wherein the group identifier is further associated with a minimum resistance value indicative of a minimum power loss due to induction heating.

7. The apparatus of claim 6, wherein the minimum power loss is zero.

8. The apparatus of claim 1, wherein the communications receiver is further configured to receive a plurality of messages comprising respective group identifiers from a plurality of wireless power receivers, and wherein the controller circuit is further configured to determine a total amount of power loss due to induction heating caused by the plurality of wireless power receivers based on the plurality of messages.

9. The apparatus of claim 1, wherein the group identifier is associated with a predefined list of groups, each group associated with a range of resistance values.

10. The apparatus of claim 1, wherein the group identifier is initially stored within a firmware of the wireless power receiver.

11. The apparatus of claim 1, wherein the controller circuit is further configured to:
determine an amount of system power loss based at least in part on the power loss value; and
reduce a power level of the power transfer component or disable the power transfer component, in response to the amount of system power loss exceeding a threshold value.

12. The apparatus of claim 1, wherein the controller circuit is further configured to determine an amount of system power loss based at least in part on the power loss value.

13. The apparatus of claim 12, wherein the amount of system power loss is further based on a power difference between a first power measurement of a first power level of the power transfer component and a second power measurement of a second power level received by the wireless power receiver.

14. An apparatus for receiving wireless power, the apparatus comprising:
a power receiving component configured to receive wireless power from a power transfer component at a power level sufficient to charge or power a load of the apparatus; and
a communications transmitter configured to send a message to a communications receiver, the message comprising a group identifier, wherein the apparatus is a member of a group associated with the group identifier, wherein the group identifier is indicative of a power loss value, the power loss value indicative of power loss due to induction heating presented by one or more wireless power receivers that are members of the group associated with the group identifier.

15. The apparatus of claim 14, wherein the group identifier is associated with a predefined list of groups, each group associated with a range of resistance values.

16. The apparatus of claim 14, wherein the group identifier is initially stored within a firmware of the apparatus.

17. A method for wirelessly transferring power, the method comprising:
wirelessly transmitting power from a power transfer component to a wireless power receiver at a power level sufficient to charge or power a load;
receiving a message from the wireless power receiver, the message comprising a group identifier; and
determining a power loss value based on the group identifier, the power loss value indicative of power loss due to induction heating presented by one or more wireless power receivers that are members of a group associated with the group identifier.

18. The method of claim 17, wherein the power loss value is further indicative of an increase in a series resistance of the power transfer component caused by metallic objects in the wireless power receiver.

19. The method of claim 17, wherein the power loss due to induction heating is indicative of an amount of power dissipated in the receiver due to the induction heating.

20. The method of claim 17, wherein the power loss value is further indicative of a maximum power loss due to induction heating and is based at least in part on a current into a coil of the power transfer component.

21. The method of claim 17, wherein the group identifier is associated with a maximum resistance value indicative of the power loss value, wherein the maximum resistance value is a maximum value of a range of resistance values associated with the group identifier.

22. The method of claim 21, wherein the group identifier is further associated with a minimum resistance value indicative of a minimum power loss due to induction heating.

23. The method of claim 22, wherein the minimum power loss is zero.

24. The method of claim 17, further comprising:
receiving a plurality of messages comprising respective group identifiers from a plurality of wireless power receivers; and
determining a total amount of power loss due to induction heating caused by the plurality of wireless power receivers based on the plurality of messages.

25. The method of claim 17, wherein the group identifier is associated with a predefined list of groups, each group associated a range of resistance values.

26. The method of claim 17, further comprising:
determining an amount of system power loss based at least in part on the power loss value; and
reducing a power level of the power transfer component or disabling the power transfer component, in response to the amount of system power loss exceeding a threshold value.

27. The method of claim 17, further comprising determining an amount of system power loss based at least in part on the power loss value.

28. The method of claim 27, wherein the amount of system power loss is further based on a power difference between a first power measurement of a first power level of the power transfer component and a second power measurement of a second power level received by the wireless power receiver.

29. A method for receiving wireless power at a device, the method comprising:
- receiving wireless power from a power transfer component at a power level sufficient to charge or power a load of the device; and
- sending a message to a communications receiver, the message comprising a group identifier, wherein the device is a member of a group associated with the group identifier, wherein the group identifier is indicative of a power loss value, the power loss value indicative of power loss due to induction heating presented by one or more wireless power receivers that are members of the group associated with the group identifier.

30. The method of claim 29, wherein the group identifier is associated with a predefined list of groups, each group associated a range of resistance values.

* * * * *